United States Patent
Jung et al.

(10) Patent No.: US 8,519,539 B2
(45) Date of Patent: Aug. 27, 2013

(54) METAL WIRE FOR A SEMICONDUCTOR DEVICE FORMED WITH A METAL LAYER WITHOUT VOIDS THEREIN AND A METHOD FOR FORMING THE SAME

(75) Inventors: Dong Ha Jung, Kyoungki-do (KR); Baek Mann Kim, Kyoungki-do (KR); Soo Hyun Kim, Seoul (KR); Young Jin Lee, Kyoungki-do (KR); Sun Woo Hwang, Kyoungki-do (KR); Jeong Tae Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 221 days.

(21) Appl. No.: 13/238,570

(22) Filed: Sep. 21, 2011

(65) Prior Publication Data

US 2012/0007240 A1  Jan. 12, 2012

Related U.S. Application Data

(62) Division of application No. 11/756,005, filed on May 31, 2007, now Pat. No. 8,043,962.

(30) Foreign Application Priority Data

Dec. 28, 2006 (KR) .................. 10-2006-0137200

(51) Int. Cl.
*H01L 23/48* (2006.01)
*H01L 23/52* (2006.01)

(52) U.S. Cl.
USPC ........... 257/751; 257/763; 257/765; 257/771; 257/E23.145

(58) Field of Classification Search
USPC ................. 257/751, E23.168, 771, 763, 765, 257/E23.145
See application file for complete search history.

(56) References Cited

U.S. PATENT DOCUMENTS

| | | | |
|---|---|---|---|
| 7,253,501 B2 * | 8/2007 | Lee et al. ...................... | 257/639 |
| 7,687,911 B2 * | 3/2010 | Dominguez et al. .......... | 257/758 |
| 2002/0121703 A1 | 9/2002 | Toyoda et al. | |
| 2005/0127511 A1 * | 6/2005 | Yang et al. .................... | 257/758 |
| 2006/0154464 A1 * | 7/2006 | Higashi ......................... | 438/597 |
| 2008/0012133 A1 | 1/2008 | Shih et al. | |
| 2008/0081473 A1 | 4/2008 | Suzuki | |

FOREIGN PATENT DOCUMENTS

| | | |
|---|---|---|
| JP | 2000-164718 A | 6/2000 |
| JP | 2000-183160 A | 6/2000 |
| KR | 1020000034526 A | 6/2000 |
| KR | 1020010065231 A | 7/2001 |

OTHER PUBLICATIONS

USPTO Restriction/Req mailed Apr. 29, 2009 in connection with U.S. Appl. No. 11/756,005.

(Continued)

*Primary Examiner* — Nitin Parekh
(74) *Attorney, Agent, or Firm* — Ladas & Parry LLP

(57) ABSTRACT

A metal wiring of a semiconductor device includes a semiconductor substrate; an insulating layer provided with a damascene pattern formed over the semiconductor substrate; a diffusion barrier layer which contains a $RuO_2$ layer formed on a surface of the damascene pattern and an Al deposit-inhibiting layer formed on a portion of the $RuO_2$ layer in both-side upper portion of the damascene pattern; and a wiring metal layer including Al formed on the diffusion barrier layer by MOCVD method in order to fill the damascene pattern.

6 Claims, 4 Drawing Sheets

(56) References Cited

OTHER PUBLICATIONS

USPTO Restriction/Req mailed Aug. 5, 2009 in connection with U.S. Appl. No. 11/756,005.

USPTO NFOA mailed Apr. 27, 2010 in connection with U.S. Appl. No. 11/756,005.

USPTO FOA mailed Oct. 13, 2010 in connection with U.S. Appl. No. 11/756,005.

USPTO NOA mailed Feb. 8, 2011 in connection with U.S. Appl. No. 11/756,005.

USPTO NOA mailed Jun. 24, 2011 in connection with U.S. Appl. No. 11/756,005.

* cited by examiner

METAL WIRE FOR A SEMICONDUCTOR DEVICE FORMED WITH A METAL LAYER WITHOUT VOIDS THEREIN AND A METHOD FOR FORMING THE SAME

CROSS-REFERENCE TO RELATED APPLICATIONS

The present application claims priority to Korean patent application number 10-2006-0137200 filed on Dec. 28, 2006, which is incorporated herein by reference in its entirety.

BACKGROUND OF THE INVENTION

The present invention relates to a metal wiring of a semiconductor device, and more particularly, to a metal wiring in a semiconductor device by forming an Al layer without creating voids therein by controlling the Al-growth characteristics, and a method for forming the same.

For highly integrated semiconductor devices, high-speed is an increasingly important requirement, and therefore memory cells are formed in a stacked structure. Moreover, the metal wiring used for carrying electric signals to the cells is also formed in a multi-layer structure. The metal wiring having the multi-layer structure provides advantageous design flexibility and allows more leeway in setting the margins for the wiring resistance, the current capacitance, etc.

Aluminum (Al) is widely used as a material for the metal wiring in a highly integrated semiconductor device, for its superior electrical conductivity and forming efficiency when applied in a fabrication process. The Al is used as a diffusion barrier layer, since it can ensure electric characteristics of the semiconductor device.

Hereinafter, a method is described for forming the metal wiring in a semiconductor device according to prior art, which uses Al as the material of a metal wiring referring to FIG. 1.

A first oxide layer 140 and a second oxide layer 160 are sequentially formed over the semiconductor substrate 100 on which a conductive patterns 110 and a interlayer insulating layer 120 are formed. Until the conductive patterns 110 is exposed, the first oxide layer 140 and the second oxide layer 160 are etched so as to form via-holes 171 defining via contact regions and trenches 172 defining metal wiring regions, thereby forming dual-type damascene pattern 170 including the via-holes 171 and the trenches 172.

A diffusion barrier layer 180 is formed on the second oxide layer 160 including the damascene pattern 170. Herein, the diffusion barrier layer 180 is formed as a stacked layer composed of a Ti layer 181 and a TiN layer 182. Al is filled in the damascene pattern 170 on which the diffusion barrier layer 180 is formed, thereby forming via contacts 193 within the via-holes 171 and the metal wirings 194 composed of Al layer within the trenches 172.

As described above according to prior art, upon forming the metal wiring using Al, the diffusion barrier layer 180 is used for preventing the electric characteristics from being degraded due to high bonding force with the oxide layer and movement and diffusion of electrons from the metal wiring. The diffusion barrier layer 180 is formed by using the Ti layer 181 and the TiN layer 182 or a stacked layer of both.

Meanwhile, as the design rule of the semiconductor device decrease, the line width of the via-hole 193 and the trench 194 would also decrease. However, if the stacked layer of the Ti layer 181 and the TiN 182 layer is formed as the diffusion barrier layer 180 on the surface of the via-hole 193 and the trench 194 at the time that the line width of the via-hole 193 and the trench 194 decreases, the margin of the line width of the via-hole 193 and the trench 194 also decreases.

This type of margin reduction of the line-width of the via-hole 193 and the trench 194 caused by the diffusion barrier layer 180 formed as the stacked layer of the Ti layer 181 and the TiN layer 182 causes overhang when depositing Al in the via-hole 193 and the trench 194 to form metal wiring. As a result, Al is not entirely filled in the via-hole 193 and the trench 194, and therefore voids are often generated within the via-hole 193 and the trench 194.

If the voids are generated on lower portion of the via-hole 193 and the trench 194 due to reduction in the line-width of the via-hole 193 and the trench 194, it causes errors in operational characteristics of the semiconductor device or decrease the total yield of the semiconductor device.

BRIEF SUMMARY OF THE INVENTION

Embodiments of the present invention are directed to a metal wiring of a semiconductor device which is capable of forming Al layer without generating voids when forming wiring Al layer in super high-integration device in accordance with MOCVD method.

In accordance with an embodiment of the present invention, a metal wiring of a semiconductor device comprises a semiconductor substrate; an insulating layer provided with a damascene pattern formed over the semiconductor substrate; a diffusion barrier layer which contains a $RuO_2$ layer formed on a surface of the damascene pattern and an Al deposit-inhibiting layer formed on a portion of the $RuO_2$ layer in both-side upper portion of the damascene pattern; and a wiring metal layer including Al formed on the diffusion barrier layer by MOCVD method in order to fill the damascene pattern.

The damascene pattern is of single type including a trench or dual type including a via-hole and the trench.

The $RuO_2$ layer has a thickness which is 5 to 10% of a width of the damascene pattern.

The Al deposit-inhibiting layer comprises a $TiO_2$ layer or an $Al_2O_3$ layer.

The Al deposit-inhibiting layer has a thickness which is 5 to 10% of a width of the damascene pattern.

The wiring metal layer including Al comprises a stacked layer of an Al layer and an Al layer including Cu In accordance with another embodiment of the present invention, a method for forming a metal wiring of a semiconductor device comprising the steps of forming an insulation layer provided with a damascene pattern over a semiconductor substrate; forming a Ru layer on the insulation layer provided with the damascene pattern; forming a first metal layer on the Ru layer by a sputtering method in order to surround both-side upper portion of the damascene pattern; forming a $RuO_2$ layer on a surface of the damascene pattern and an Al deposit-inhibiting layer on both-side upper portion of the damascene pattern by oxidizing the first metal layer and the Ru layer so as to form a diffusion barrier layer composed of the $RuO_2$ layer and the Al deposit-inhibiting layer; and forming a second metal layer including Al for wiring on the diffusion barrier layer by MOCVD method in order to fill the damascene pattern.

The damascene pattern is of single type including a trench or dual type including a via-hole and the trench.

The $RuO_2$ layer has a thickness which is 5 to 10% of a width of the damascene pattern.

The Ru layer is formed by CVD method or ALD method.

The first metal layer is formed with a Ti layer or an Al layer.

The Al deposit-inhibiting layer is composed of a $TiO_2$ layer or an $Al_2O_2$ layer.

The Al deposit-inhibiting layer has a thickness which is 5 to 10% of a width of the damascene pattern.

The first metal layer and the Ru layer are oxidized by heat treatment or plasma treatment in an oxygen atmosphere.

The method for forming the metal wiring of the semiconductor device further comprises the steps of forming an Al layer including Cu on the a second metal layer including Al for wiring after forming the second metal layer including Al for wiring; performing heat-treatment on the Al layer including Cu; and performing CMP on the Al layer including Cu, the Al layer and the diffusion barrier layer until the insulating layer is exposed.

The Al layer including Cu is formed by sputtering method in temperature of 350 to 560° C.

DESCRIPTION OF SPECIFIC EMBODIMENTS

In accordance with the present invention, a $RuO_2$ layer is formed on the surface of an insulating layer provided with a damascene pattern, and an Al deposit-inhibiting layer composed of a $TiO_2$ layer or an $Al_2O_3$ is formed on a portion of the $RuO_2$ layer in both-side upper portion of the damascene pattern, thereby providing a diffusion barrier layer composed of the $RuO_2$ layer and the Al deposit-inhibiting layer.

The $RuO_2$ layer has the electrical characteristics even though it is an oxide layer, and the $TiO_2$ layer or $Al_2O_3$ layer, which is the Al deposit-inhibiting layer, has the insulating characteristics like an oxide layer.

Since the present invention has the $RuO_2$ layer having the electrical characteristics to be formed on the surface of the damascene pattern, and the $TiO_2$ layer or the $Al_2O_3$ layer having the insulating characteristics to be formed as Al deposit-inhibiting layer on the portion of the $Ru_2$ layer on both-side upper portion of the damascene pattern, it is possible to deposit the Al layer in the damascene pattern without generating voids upon depositing the wiring Al layer according to a metal organic chemical vapor deposition (MOCVD) method.

More specifically, when depositing the wiring Al layer according to the MOCVD method in which the deposition is performed as the metal organic source gas is decomposed only on a portion having metal characteristics, a source of the Al layer is not decomposed on the portion of the Al deposit-inhibiting layer formed on both-side upper portion of the damascene pattern, but decomposed on the portion of the $RuO_2$ layer formed on both-side lower portion of the damascene pattern.

The Al layer is not deposited, because the metal organic source is not decomposed on the portion of the Al deposit-inhibiting layer, and the Al layer is deposited on the lower portion of the damascene pattern by bottom-up growth because the metal organic source is decomposed on the portion of the $RuO_2$ layer.

Therefore, since the present invention is allowed to deposit the Al layer without generating an overhang despite of reduction in line-width of the damascene pattern according to ultra high-integration upon depositing the wiring Al layer according to the MOCVD method, it is possible to deposit the Al layer without generating voids in the damascene pattern.

As a result, the present invention is allowed to prevent errors on operational characteristics of the semiconductor device due to void generation, thereby to cause improvements of the characteristics and total yield in the semiconductor device.

Hereafter, a method for forming a metal wiring in a semiconductor device according to an embodiment of the present invention will be described with reference to FIG. 2A through 2F.

Figure 1:
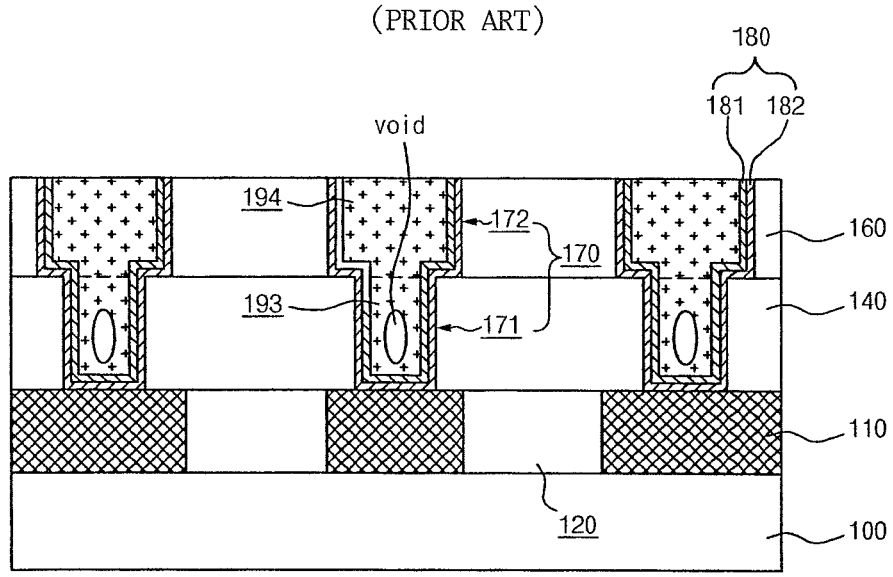
FIG. 1 is a cross-sectional view illustrating the process of a method for forming a metal wiring of a semiconductor device in accordance with the prior art.
Figure 2A:
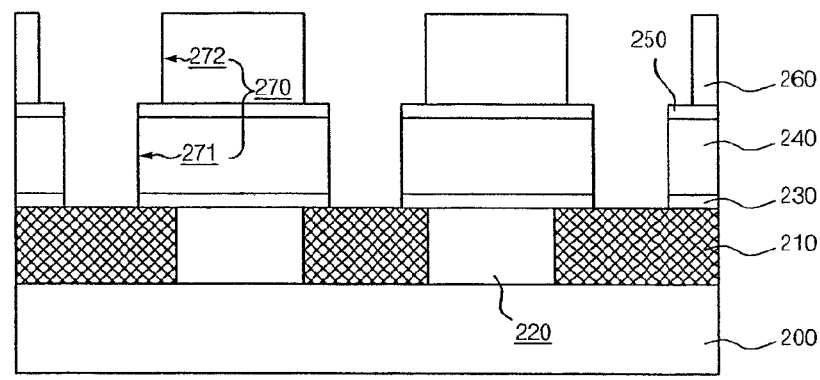
FIGS. 2A through 2F are cross-sectional views illustrating a method for forming a metal wiring of a semiconductor device in accordance with an embodiment of the present invention.

Referring to FIG. 2A, conductive patterns 210 are formed over a semiconductor substrate 200. An interlayer insulating layer 220 is formed between the conductive patterns 210. A passivation layer 230, a first insulating layer 240, an etch prevention layer 250, and a second insulating layer 260 are sequentially formed over the conductive patterns 210 and interlayer insulating layer 220.

The passivation layer 230 can prevent the conductive patterns 210 from being damaged upon forming the via-holes. The etch prevention layer 250 can prevent the first layer 230 from being etched upon forming the trenches. The first insulating layer 240 and the second insulating layer 260 are formed with oxide-based materials.

Trenches 272 defining the metal wiring regions are formed by etching the second insulating layer 260. A via-holes 271 exposing the conductive patterns 210 are formed by etching the etch prevention layer 250, the first layer 240, and the passivation layer 230, thereby providing damascene pattern 270 of dual type including the via-holes 271 exposing conductive patterns 210 and the trenches 272 defining metal wiring regions.

The damascene pattern 270 is also capable of being formed as a single type. In this case, an insulating layer would be formed over the conductive patterns 210 and the interlayer insulating layer 246 and then the insulating layer 246 would be etched, thereby providing a single type damascene pattern exposing the conductive patterns and defining the metal wiring region.

Figure 2B:
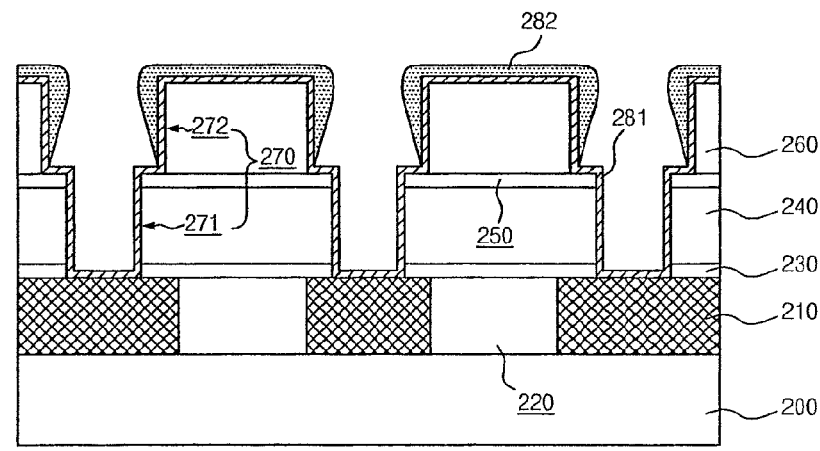

Referring to FIG. 2B, a Ru layer 281 is deposited in uniform thickness on the dual-type damascene pattern 270 including the trench 271 and the via-hole 272 by a chemical vapor deposition (CVD) method or an atomic Layerlayer deposition (ALD) method, which are superior in step coverage characteristics. The Ru layer 281 has a thickness which is 5-10% of a width of the damascene pattern 270.

A first metal layer 282 is deposited on the Ru layer 281 by sputtering method so that it may surround the both-side upper portion of the damascene pattern 270. The first metal layer is deposited with Ti layer or Al layer so as to have a thickness which is 5~10% of the width of the damascene pattern 270.

The first metal layer 282 is not uniformly deposited on the total surface of the damascene pattern 270, but is deposited only on the Ru layer 270 of trench upper portion including side surface of the trench 272 of the damascene pattern, since it is deposited by the sputtering method, which is poor in the step-coverage characteristics.

Figure 2C:
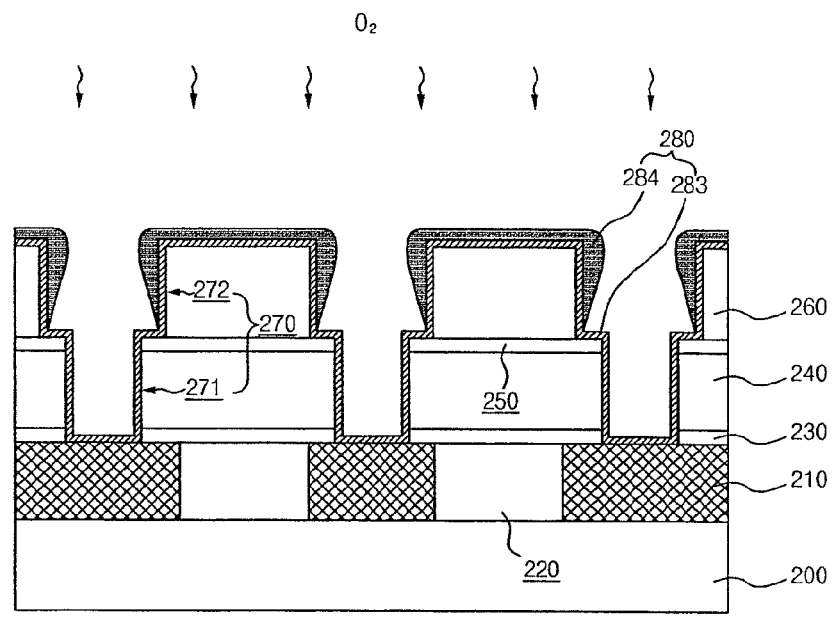

Referring to FIG. 2C, the Ti layer or the Al layer of the first metal layer 282 and the Ru layer 281 are oxidized. The $RuO_2$ layer 283 is formed on the surface of the damascene pattern 270, and the $TiO_2$ layer or the $Al_2O_3$ layer is formed on the both-side upper portion of the damascene pattern 270 as Al deposit-inhibiting layer 284 due to the oxidation, thereby providing the diffusion barrier layer 280 which is composed of the $RuO_2$ layer 283 and the Al deposit-inhibiting layer 284.

The first metal layer 282 and the Ru layer 281 are oxidized in $O_2$ atmosphere by a heat or plasma treatment method.

Figure 2D:
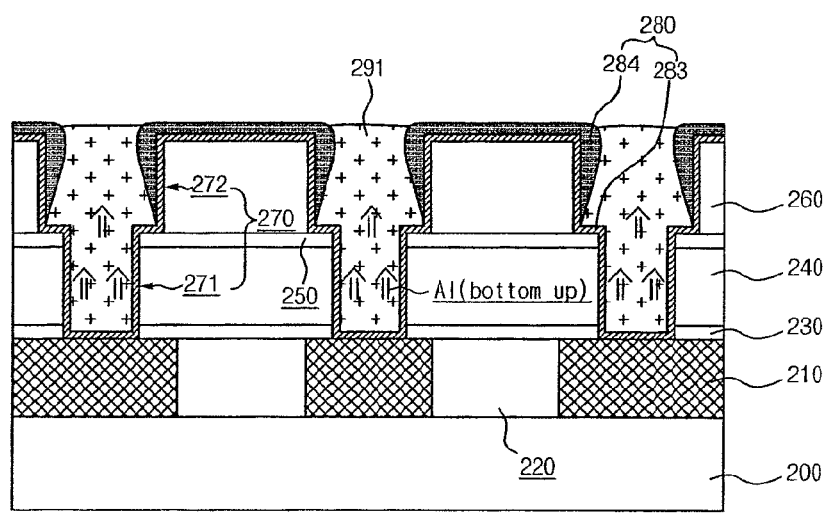

Referring to FIG. 2D, a second metal layer for wiring 291 is formed on the diffusion barrier layer 280 in accordance with a metal organic chemical vapor deposition (MOCVD) method so that the damascene pattern 270 may be filled. The second metal layer 291 is formed with Al.

The MOCVD method causes a layer to be formed via generation and growth of cells by decomposing the metal organic source gas only on portions having the metallic characteristics.

Consequently, since the metal organic source is not decomposed on the Al deposit-inhibiting layer 284 having the insulating characteristics like an oxide layer when depositing the Al layer of the second metal layer 291 in accordance with the MOCVD method, the Al layer is not deposited on the Al deposit-inhibiting layer 284 formed on upper portion of the damascene pattern.

Since the metal organic source is decomposed on the $RuO_2$ layer having the electrical characteristics even though being an oxide layer, the Al layer is deposited on the portion of the $RuO_2$ layer formed on the lower portion of the damascene pattern via generation and growth of cells of the Al, whereby the Al layer is deposited on the lower portion of the damascene pattern by bottom-up growth.

Since the present invention causes the Al layer to be deposited without generating an overhang upon depositing the Al layer according to the MOCVD method, it is possible to deposit the Al layer without generating voids in the damascene pattern in spite of the reduction in the line-width of the damascene pattern due to ultra high-integration.

Consequently, the present invention inhibits the possibility of the errors on the operational characteristics of the semiconductor device due to presence of voids in the metal lines, thereby improving the performance characteristics as well as the total yield of the semiconductor device.

Figure 2E:
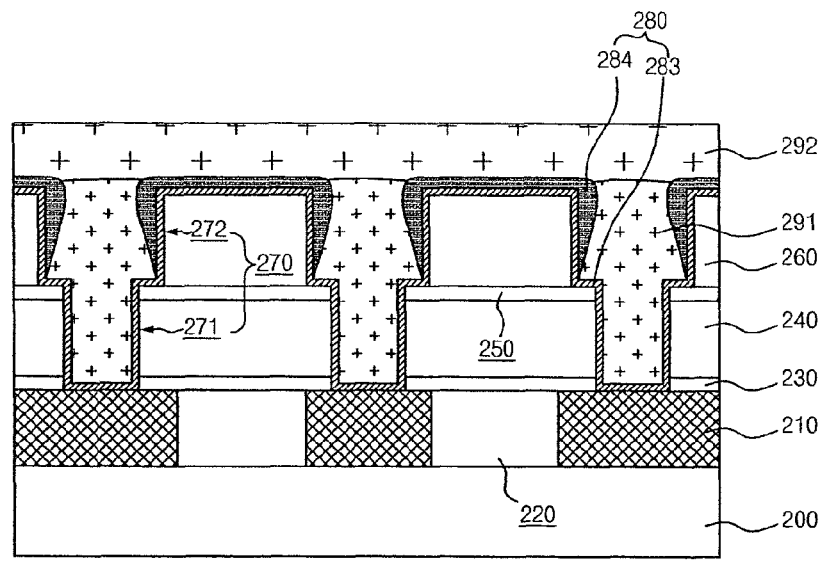

Referring to FIG. 2E, the Al layer including Cu 292 is deposited on the Al layer 291 of the second metal layer. The Al layer including Cu 292 is deposited by the sputtering method at a temperature of 350-560° C. The Al layer including Cu 292 is subjected to a heat-treatment process for a certain duration of time in order to maintain the high temperature.

As the Al layer including Cu 292 is deposited on the Al layer 291 of the second metal layer while being maintained in high temperature, the Cu of the Al layer including Cu 292 is diffused toward the Al layer 291, which results in improving the electron migration (EM) characteristics of the Al layer 291.

Figure 2F:
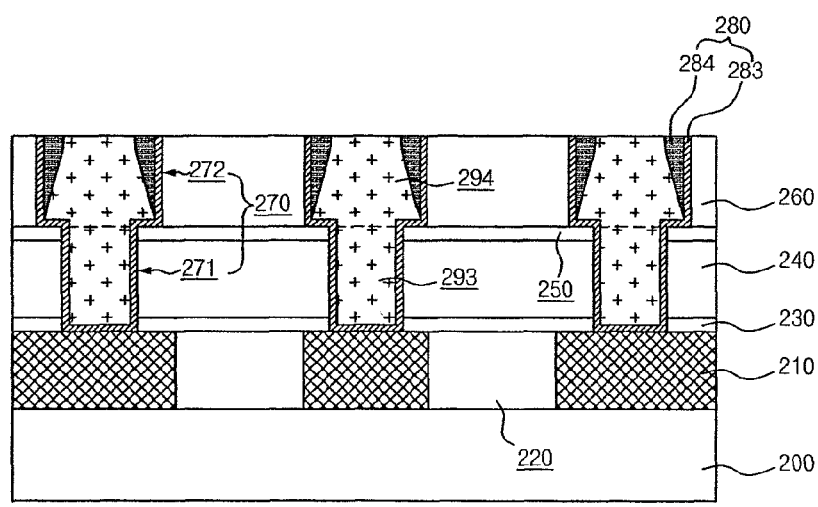

Referring to FIG. 2F, the Al layer including Cu 292 and the Al layer 291 are subject to a chemical mechanical polishing (CMP) process until the insulating layer 246 is exposed. Therefore, the via contact 293 is formed inside the via-hole 271 of the damascene pattern 270 and the metal wiring 294 composed of the Al layer including Cu 292 is formed inside the trench 272 of the damascene pattern 270, thereby providing the metal wiring of the semiconductor device according to one embodiment of the present invention.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor device having a metal wiring comprising:
    a semiconductor substrate;
    an insulating layer provided with a damascene pattern formed over the semiconductor substrate;
    a diffusion barrier layer which contains a Ruthenium oxide (RuO2) layer formed on a surface of lower portion of the damascene pattern and an Al deposit-inhibiting layer formed on a surface of upper portion of the damascene pattern excluding a surface of the lower portion of the damascene pattern, and
    a wiring metal layer including aluminum (Al) formed on the diffusion barrier layer by a metal organic chemical vapor deposition (MOCVD) method in order to fill the damascene pattern.

2. The semiconductor device according to claim 1, wherein the damascene pattern is of single type including a trench or dual type including a via-hole and the trench.

3. The semiconductor device according to claim 1, wherein the $RuO_2$ layer has a thickness which is 5 to 10% of a width of the damascene pattern.

4. The semiconductor device according to claim 1, wherein the Al deposit-inhibiting layer comprises a titanium dioxide (TiO2) layer and an aluminum oxide (Al2O3) layer.

5. The semiconductor device according to claim 4, wherein the Al deposit-inhibiting layer has a thickness which is 5 to 10% of a width of the damascene pattern.

6. The semiconductor device according to claim 1, wherein the wiring metal layer including Al comprises a stacked layer of an Al layer and an Al layer including copper (Cu).

* * * * *